United States Patent
Otsuka et al.

(10) Patent No.: US 8,084,188 B2
(45) Date of Patent: Dec. 27, 2011

(54) RADIATION-SENSITIVE RESIN COMPOSITION

(75) Inventors: Noboru Otsuka, Tokyo (JP); Takanori Kawakami, Tokyo (JP)

(73) Assignee: JSR Corporation, Tokyo (JP)

( * ) Notice: Subject to any disclaimer, the term of this patent is extended or adjusted under 35 U.S.C. 154(b) by 334 days.

(21) Appl. No.: 12/557,529

(22) Filed: Sep. 11, 2009

(65) Prior Publication Data

US 2010/0068647 A1  Mar. 18, 2010

(30) Foreign Application Priority Data

Sep. 12, 2008  (JP) .................................. 2008-234271

(51) Int. Cl.
*G03F 7/004* (2006.01)

(52) U.S. Cl. ...................... 430/270.1; 430/905; 430/910

(58) Field of Classification Search ............... 430/270.1, 430/905, 910
See application file for complete search history.

(56) References Cited

U.S. PATENT DOCUMENTS

| 6,656,660 | B1 * | 12/2003 | Urano et al. ............... 430/270.1 |
| 7,544,460 | B2 * | 6/2009 | Hada et al. ................. 430/270.1 |
| 7,682,770 | B2 * | 3/2010 | Hada et al. ................. 430/270.1 |
| 2007/0269754 | A1 | 11/2007 | Fujiwara et al. |

FOREIGN PATENT DOCUMENTS

| JP | 2002-145955 | 5/2002 |
| JP | 2002-201232 | 7/2002 |
| JP | 2003-084436 | 3/2003 |
| JP | 2005-068418 | 3/2005 |

* cited by examiner

*Primary Examiner* — John Chu
(74) *Attorney, Agent, or Firm* — Ditthavong Mori & Steiner, P.C.

(57) ABSTRACT

A radiation-sensitive resin composition includes an acid-dissociable group-containing resin, a radiation-sensitive acid generator, and a solvent. The acid-dissociable group-containing resin includes a copolymer containing a repeating unit. The reparing unit includes an acid-dissociable group-containing repeating unit in an amount of more than about 55 mol % of a total amount of the repeating units in the copolymer. A content of the copolymer in the acid-dissociable group-containing resin is about 90 mass % or more of a total amount of the acid-dissociable group-containing resin.

8 Claims, No Drawings

RADIATION-SENSITIVE RESIN COMPOSITION

CROSS-REFERENCE TO RELATED APPLICATIONS

This application claims priority under 35 U.S.C. §119 to Japanese Patent Application No. 2008-234271, filed Sep. 12, 2008. The contents of this application are incorporated herein by reference in their entirety.

BACKGROUND OF THE INVENTION

1. Field of the Invention

The present invention relates to a radiation-sensitive resin composition.

2. Discussion of the Background

In the field of microfabrication represented by fabrication of integrated circuit devices, a photolithographic technology enabling microfabrication with a line width of about 100 nm or less using an ArF excimer laser (wavelength: 193 nm) or the like has been demanded in order to achieve a higher degree of integration. As a radiation-sensitive composition applicable to excimer laser radiation, a number of chemically-amplified radiation-sensitive compositions utilizing a chemical amplification effect between a component having an acid-dissociable functional group and an acid generator which is a component generating an acid upon irradiation, have been proposed. For example, a photoresist polymer compound containing a resin component with a specific structure which contains a monomer unit having a norbornane ring derivative as a resin component has been known (for example, JP-A-2002-201232 and JP-A-2002-145955). A resist composition using (meth)acrylic acid copolymer with a narrow molecular weight distribution which contains an ester of a (meth)acrylic acid with a specific monocyclohexane carbolactone, bicycloheptane carbolactone, or the like as a repeating unit has also been known (for example, JP-A-2003-84436). Moreover, a radiation-sensitive resin composition containing an acrylic polymer which contains a repeating unit having a lactone ring, a repeating unit having a polyalicyclic hydrocarbon group consisting only of carbon and hydrogen and not containing a polar group, and a repeating unit having an acid-dissociable group has been known to reduce pattern line edge roughness after development and heat treatment dependence after irradiation when used as a chemically-amplified resist responding to deep ultraviolet rays represented by an ArF excimer laser (wavelength: 193 nm) (for example, JP-A-2005-68418).

However, in order to achieve a higher degree of integration of semiconductor devices, a radiation-sensitive resin composition used as a resist has been required to possess more excellent resolution. In addition, along with the progress of miniaturization, low focus latitude and pattern form degradation have become serious problems. In order to deal with these problems, urgent development of a radiation-sensitive resin composition excelling in resolution, having a wide focus latitude, and producing an excellent pattern shape has been desired.

SUMMARY OF THE INVENTION

A radiation-sensitive resin composition of the present invention includes an acid-dissociable group-containing resin (hereinafter referred to as "resin (A)"), a radiation-sensitive acid generator (hereinafter referred to as "acid generator (B)"), and a solvent (hereinafter referred to as "solvent (C)"), the resin (A) including a copolymer containing an acid-dissociable group-containing repeating unit in an amount of more than about 55 mol % of all of the repeating units forming the copolymer, and the content of the copolymer in the resin (A) being about 90 mass % or more.

In the radiation-sensitive resin composition according to an embodiment of the present invention, the acid-dissociable group-containing repeating unit may be shown by the following formula (1) or (2),

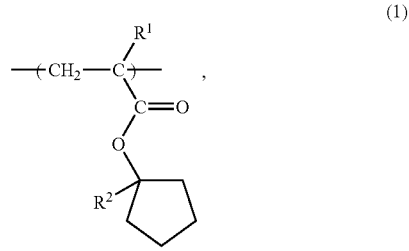

(1)

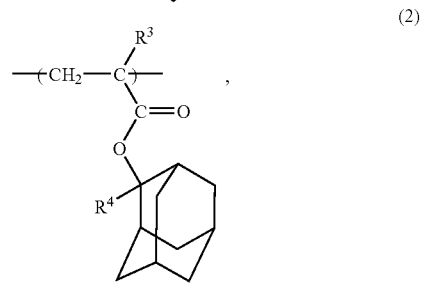

(2)

wherein $R^1$ and $R^3$ individually represent a hydrogen atom, a methyl group, or a trifluoromethyl group, and $R^2$ and $R^4$ individually represent a hydrogen atom or a substituted or unsubstituted alkyl group having 1 to 4 carbon atoms.

In the radiation-sensitive resin composition according to an embodiment of the present invention, the acid generator (B) may contain a radiation-sensitive acid generator shown by the following formula (6) or (7),

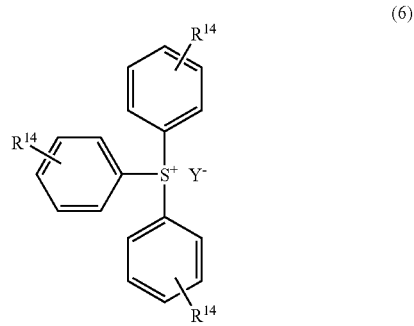

(6)

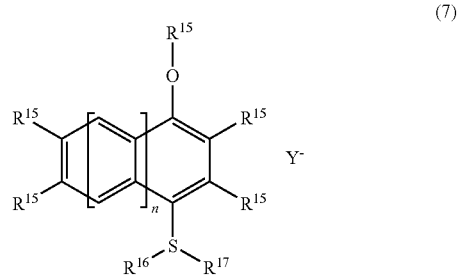

(7)

wherein $R^{14}$ individually represents a hydrogen atom, a fluorine atom, a hydroxyl group, an alkyl group having 1 to 10 carbon atoms, an alkoxyl group, or an alkoxycarbonyl group having 2 to 11 carbon atoms, $R^{15}$ individually represents a hydrogen atom or a linear or branched alkyl group having 1 to 4 carbon atoms, n represents 0 or 1, $R^{16}$ and $R^{17}$ individually represent a hydrogen atom or a linear or branched alkyl group having 1 to 4 carbon atoms, or in combination form a 3 to 6-membered ring structure together with the sulfur atom, and $Y^-$ represents a sulfur atom-containing anion.

The acid generator (B) may include at least three different types of radiation-sensitive acid generators.

Since the radiation-sensitive resin composition according to an embodiment of the present invention includes the resin (A), the acid generator (B), and the solvent (C), the composition responds to deep ultraviolet rays typified by an ArF excimer laser (wavelength: 193 nm), exhibits high radiation transparency, possesses superior basic resist properties such as excellent sensitivity and dry etching resistance, exhibits high resolution and focus latitude, and produces an excellent pattern shape. The composition is useful for manufacturing integrated circuit devices which are anticipated to become more and more scaled down in the future.

DETAILED DESCRIPTION OF THE INVENTION

Embodiments of the present invention are described in detail below. Note that the present invention is not limited to the following embodiments. Various modifications, improvements, and the like may be appropriately made with regard to the design without departing from the scope of the present invention based on common knowledge of a person skilled in the art.

The radiation-sensitive resin composition according to an embodiment of the present invention is a chemically-amplified positive-tone resist composition including the resin (A) which includes a copolymer containing an acid-dissociable group-containing repeating unit in an amount of more than about 55 mol % of all of the repeating units forming the copolymer, the content of the copolymer in the resin (A) being about 90 mass % or more. Due to this particular resin composition, the radiation-sensitive resin composition according to the embodiment of the present invention can be suitably used as an chemically-amplified resist (positive-tone resist) having excellent basic resist properties, exhibiting excellent focus latitude, and producing an excellent pattern shape.

Resin (A)

The resin (A) includes a copolymer containing an acid-dissociable group-containing repeating unit in an amount of more than about 55 mol % of all of the repeating units forming the copolymer. The content of the copolymer in the resin (A) is about 90 mass % or more.

The acid-dissociable group-containing repeating unit is preferably the repeating unit shown by the formula (1) or (2) (hereinafter referred to as "repeating unit (1) or (2)").

As examples of the substituted or unsubstituted alkyl group having 1 to 4 carbon atoms represented by $R^2$ and $R^4$ in the repeating units (1) and (2), a methyl group, an ethyl group, an n-propyl group, an i-propyl group, an n-butyl group, and the like can be given.

The following groups can be given as specific examples of the repeating unit (1).

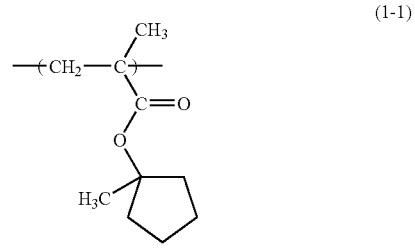

(1-1)

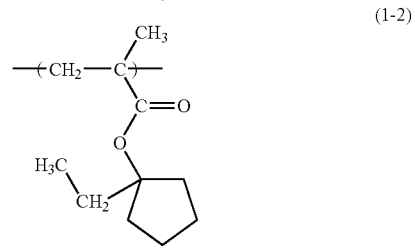

(1-2)

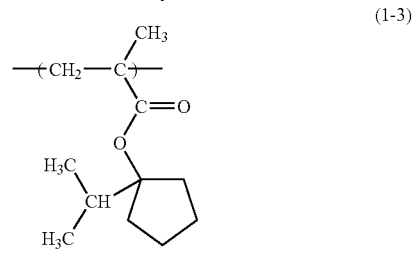

(1-3)

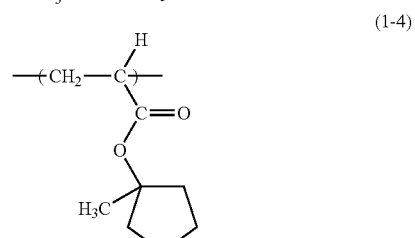

(1-4)

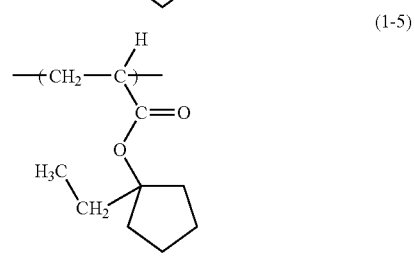

(1-5)

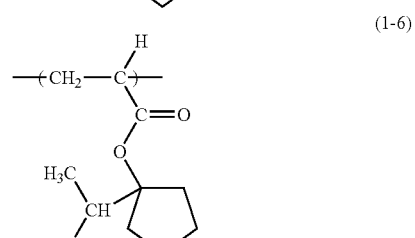

(1-6)

Among the above examples, the repeating units (1-1) and (1-2) are preferable to ensure excellent roundness and focus latitude which are described later.

The following groups can be given as specific examples of the repeating unit (2).

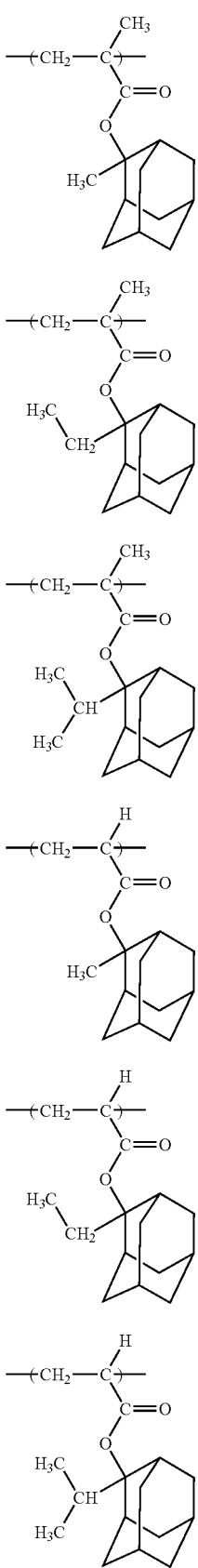

(2-1)
(2-2)
(2-3)
(2-4)
(2-5)
(2-6)

Among the above examples, the repeating units (2-1) and (2-2) are preferable to ensure excellent LWR and focus latitude which are described later.

The copolymer may contain a repeating unit (3) in addition to the repeating unit (1) or (2).

As examples of the repeating unit (3), a repeating unit having a lactone skeleton (hereinafter referred to from time to time as "repeating unit (3-1)"), a repeating unit having a bistrifluoromethylhydroxymethyl group (hereinafter referred to from time to time as "repeating unit (3-2)"), a repeating unit having a substituted adamantyl group (hereinafter referred to from time to time as "repeating unit (3-3)"), and the like can be given. Of these, the repeating unit (3-1) is particularly preferable.

Examples of the repeating unit (3-1) having a lactone skeleton include units obtainable by cleavage of a polymerizable unsaturated bond of compounds such as
5-oxo-4-oxa-tricyclo[4.2.1.0$^{3,7}$]non-2-yl(meth)acrylate,
9-methoxycarbonyl-5-oxo-4-oxa-tricyclo[4.2.1.0$^{3,7}$]non-2-yl(meth)acrylate,
5-oxo-4-oxatricyclo[5.2.1.0$^{3,8}$]dec-2-yl(meth)acrylate,
10-methoxycarbonyl-5-oxo-4-oxa-tricyclo[5.2.1.0$^{3,8}$]non-2-yl(meth)acrylate,
6-oxo-7-oxa-bicyclo[3.2.1]oct-2-yl(meth)acrylate,
4-methoxycarbonyl-6-oxo-7-oxa-bicyclo[3.2.1]oct-2-yl (meth)acrylate,
7-oxo-8-oxa-bicyclo[3.2.1]oct-2-yl(meth)acrylate,
4-methoxycarbonyl-7-oxo-8-oxa-bicyclo[3.3.1]non-2-yl (meth)acrylate,
2-oxotetrahydropyran-4-yl(meth)acrylate,
4-methyl-2-oxotetrahydropyran-4-yl(meth)acrylate,
4-ethyl-2-oxotetrahydropyran-4-yl(meth)acrylate,
4-propyl-2-oxotetrahydropyran-4-yl(meth)acrylate,
5-oxotetrahydrofuran-3-yl(meth)acrylate,
2,2-dimethyl-5-oxotetetrahydrofuran-3-yl(meth)acrylate,
4,4-dimethyl-5-oxotetetrahydrofuran-3-yl(meth)acrylate,
2-oxotetrahydrofuran-3-yl(meth)acrylate,
4,4-dimethyl-2-oxotetetrahydrofuran-3-yl(meth)acrylate,
5,5-dimethyl-2-oxotetetrahydrofuran-3-yl(meth)acrylate,
2-oxotetrahydrofuran-3-yl(meth)acrylate,
5-oxotetetrahydrofuran-2-ylmethyl(meth)acrylate,
3,3-dimethyl-5-oxotetetrahydrofuran-2-ylmethyl(meth) acrylate,
4,4-dimethyl-5-oxotetetrahydrofuran-2-ylmethyl(meth) acrylate, and groups shown by the following formula (3).

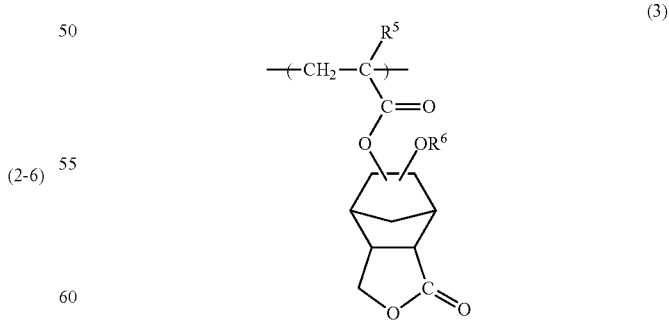

(3)

wherein $R^5$ represents a hydrogen atom, a methyl group, or a trifluoromethyl group, and $R^6$ represents a linear or branched alkyl group having 1 to 12 carbon atoms, a cycloalkyl group, an alkylcarbonyl group having 2 to 13 carbon atoms, or a hydroxyalkyl group having 1 to 12 carbon atoms.

As examples of the linear or the branched alkyl group having 1 to 12 carbon atoms represented by $R^6$, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, an n-undecyl group, an n-dodecyl group, and the like can be given.

As examples of the alkylcarbonyl group having 2 to 13 carbon atoms represented by $R^6$, a methylcarbonyl group, an ethylcarbonyl group, an n-propylcarbonyl group, an i-propylcarbonyl group, an n-butylcarbonyl group, a t-butylcarbonyl group, an n-pentylcarbonyl group, an n-hexylcarbonyl group, an n-heptylcarbonyl group, and the like can be given.

As examples of the hydroxyalkyl group having 1 to 12 carbon atoms represented by $R^6$, a hydroxymethyl group, a hydroxyethyl group, a hydroxypropyl group, a hydroxybutyl group, a hydroxypentyl group, a hydroxyhexyl group, a hydroxyheptyl group, and the like can be given.

As examples of the repeating unit (3-2) having a bistrifluoromethylhydroxymethyl group, the repeating units shown by the following formula (4) can be given.

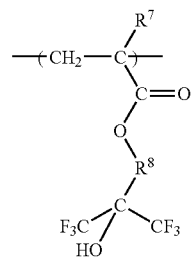

(4)

wherein $R^7$ represents a hydrogen atom, an alkyl group having 1 to 4 carbon atoms, a trifluoromethyl group, or a hydroxymethyl group, and $R^8$ represents a divalent organic group.

As examples of the alkyl group having 1 to 4 carbon atoms represented by $R^7$ in the formula (4), a methyl group, an ethyl group, an n-propyl group, an i-propyl group, an n-butyl group, a 2-methylpropyl group, a 1-methylpropyl group, a t-butyl group, and the like can be given.

As examples of the divalent organic group represented by $R^8$ in the formula (4), a divalent hydrocarbon group, an alkylene glycol group, an alkylene ester group, and the like can be given. Of these, a divalent hydrocarbon group is preferable, with a linear or cyclic divalent hydrocarbon group being more preferable.

As preferable examples of $R^8$, saturated linear hydrocarbon groups such as a methylene group, an ethylene group, a propylene group (e.g., a 1,3-propylene group, a 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as cycloalkylene groups having 3 to 10 carbon atoms such as cyclobutylene groups (e.g., 1,3-cyclobutylene group), cyclopentylene groups (e.g., 1,3-cyclopentylene group), cyclohexylene groups (e.g., 1,4-cyclohexylene group), and cyclooctylene groups (e.g., 1,5-cyclooctylene group); bridged cyclic hydrocarbon groups having 4 to 30 carbon atoms such as norbornylene groups (e.g., 1,4-norbornylene group, 2,5-norbornylene group), and admantylene groups (e.g., 1,5-admantylene group, 2,6-admantylene group); and the like can be given.

When $R^8$ is a divalent alicyclic hydrocarbon group, it is preferable to insert an alkylene group having 1 to 4 carbon atoms as a spacer between the bistrifluoromethylhydroxymethyl group and the alicyclic hydrocarbon group.

As $R^8$, a hydrocarbon group having a 2,5-norbornylene group, a 1,2-ethylene group, and a propylene group are preferable.

As examples of the repeating unit (3-3) having a substituted adamantyl group, the repeating units shown by the following formula (5) can be given.

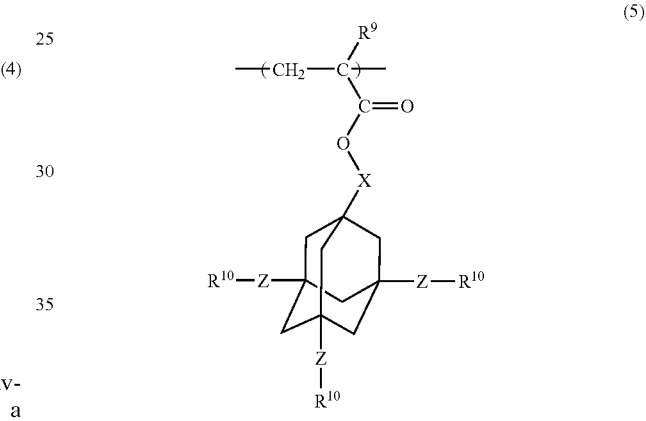

(5)

wherein $R^9$ represents a hydrogen atom or a methyl group, X represents a single bond or a divalent organic group having 1 to 3 carbon atoms, Z individually represents a single bond or a divalent organic group having 1 to 3 carbon atoms, and $R^{10}$ individually represents a hydrogen atom, a hydroxyl group, a cyano group, or a $-COOR^{11}$ group.

A methylene group, an ethylene group, and a propylene group can be given as the divalent organic group having 1 to 3 carbon atoms represented by X and Z in the formula (5).

$R^{11}$ in the $COOR^{11}$ group which is represented by $R^{10}$ of the formula (5) represents a hydrogen atom, a linear or branched alkyl group having 1 to 4 carbon atoms, or an alicyclic alkyl group having 3 to 20 carbon atoms.

As examples of the linear or branched alkyl group having 1 to 4 carbon atoms represented by $R^{11}$, a methyl group, an ethyl group, an n-propyl group, an i-propyl group, an n-butyl group, a 2-methylpropyl group, a 1-methylpropyl group, and a t-butyl group can be given.

As examples of the alicyclic alkyl group having 3 to 20 carbon atoms represented by $R^{11}$, a cycloalkyl group represented by $-C_nH_{2n+1}$ (wherein n is an integer from 3 to 20) such as a cyclopropyl group, a cyclobutyl group, a cyclopentyl group, a cyclohexyl group, a cycloheptyl group, and a cyclooctyl group, polyalicyclic groups such as a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and an adamantyl group can be given. A group in which the cycloalkyl group or the polyalicyclic group is substituted with one or more linear, branched, or cyclic alkyl groups can also be given.

It is preferable that at least one of the three $R^{10}$s in the formula (5) be other than a hydrogen atom and when X is a single bond, at least one of the three Zs be the divalent organic group having 1 to 3 carbon atoms.

As examples of the repeating units (3) other than the repeating units (3-1) to (3-3), units obtained by cleavage of a polymerizable unsaturated bond of compounds such as bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tetracyclo[6.2.1.1$^{3,6}$.0$^{2,7}$]dodec-9-yl(meth)acrylate, tricyclo[3.3.1.1$^{3,7}$]dec-1-yl(meth)acrylate, and tricyclo[3.3.1.1$^{3,7}$]dec-2-yl(meth)acrylate can be given. Either one type or two or more types of these repeating units (3) may be included.

As specific examples of the copolymer, a copolymer (CP-1) or a copolymer (CP-2) which includes the following repeating units can be given.

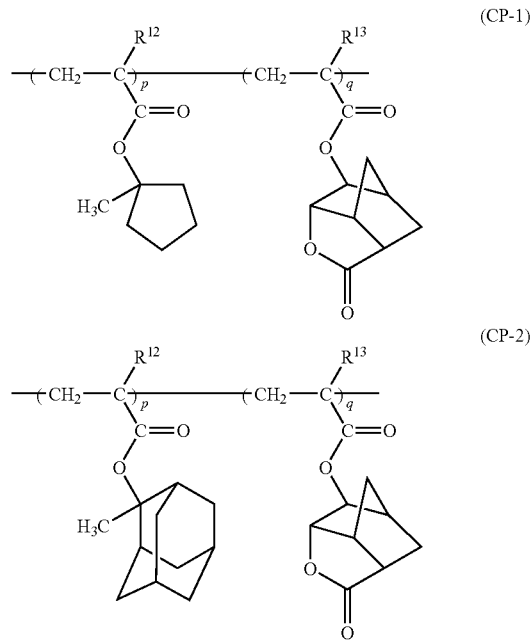

wherein $R^{12}$ and $R^{13}$ individually represent a hydrogen atom or a methyl group.

The content of the repeating unit (1) or the repeating unit (2) in the copolymer contained in the resin (A) is more than about 55 mol %, and preferably more than about 55 mol % but not more than about 80 mol %, and more preferably more than about 55 mol % but not more than about 70 mol % (the total content of all of the repeating units in the copolymer is about 100 mol %). If the content of the repeating unit (1) or the repeating unit (2) is about 55 mol % or less, focus latitude may be insufficient.

Specifically, in the case of the copolymer (CP-1) or (CP-2), it is preferable that the content of the repeating unit (p) be more than about 55 mol % but not more than about 80 mol %, and the content of the repeating unit (q) be more than about 20 mol % but not more than about 45 mol %. More preferably, the content of the repeating unit (p) is more than about 55 mol % but not more than about 70 mol %, and the content of the repeating unit (q) is more than about 30 mol % but not more than about 45 mol %.

The polystyrene-reduced weight average molecular weight (hereinafter abbreviated as "Mw") of the copolymer measured by gel permeation chromatography (GPC) is usually 1000 to 100,000, preferably 1000 to 50,000, and more preferably 3000 to 50,000. If the Mw is less than 1000, the heat resistance of the resist may decrease. On the other hand, if more than 10,000, the pattern shape may be impaired.

The ratio (Mw/Mn) of the Mw to the polystyrene-reduced number average molecular weight (hereinafter referred to as "Mn") of the copolymer is usually 1 to 5, and preferably 1 to 3.

The above copolymer can be prepared by, for example, polymerizing a mixture of monomers that can produce the above repeating units using a polymerization initiator in an appropriate solvent in the presence of a chain transfer agent, as required.

As examples of the polymerization initiator, radical polymerization initiators such as hydroperoxides, dialkylperoxides, diacylperoxides, and azo compounds can be given. Among these, the azo compounds are preferable, with azobisisobutyronitrile being particularly preferable.

As examples of the solvent which can be used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol and propylene glycol monomethyl ether; and the like can be given. These solvents may be used either individually or in combination of two or more.

The polymerization temperature is usually 40 to 120° C., and preferably 50 to 100° C. The polymerization time is usually 1 to 48 hours, and preferably 1 to 24 hours.

It is preferable that the copolymer contain only a small amount of impurities such as a metal. The content of residual monomers and oligomers is preferably less than a specific value, for example, the content determined by HPLC is preferably not more than 0.1 mass %. Satisfying these requirements not only improves sensitivity, resolution, process stability, and pattern configuration of the resist, but provides a resist with only a small change in foreign matter content and sensitivity over time.

As examples of the purification method for the copolymer, the following methods can be given.

As a method for removing impurities such as a metal, a method of causing a metal in the polymer solution to be adsorbed using a zeta-potential filter, a method of causing a metal to be in a chelate state by washing the polymer solution with an acidic aqueous solution such as oxalic acid or sulfonic acid and removing the metal, and the like can be given.

As a method for removing residual monomers and oligomer components to a concentration of not more than a specific level, a liquid-liquid extraction method in which the residual monomers and oligomer components are removed by combining washing with water and a suitable solvent, a purification method in a solution state such as ultrafiltration in which only the components having a molecular weight of not more than a specific value are extracted and removed, a reprecipitation method in which the residual monomers and the like are removed by adding the polymer solution to a poor solvent dropwise, thereby causing the polymer solution to coagulate in the poor solvent, a purification method in a solid state in which the polymer slurry separated by filtration is washed with a poor solvent, and the like can be given. These methods may be used in combination.

The poor solvent used in the reprecipitation method is appropriately selected according to the properties and the like of the polymer to be purified.

The acid-dissociable group-containing resin (A) which forms the radiation-sensitive resin composition according to the embodiment of the present invention contains the above copolymer in an amount of about 90 mass % or more. If the amount of the copolymer is less than about 90 mass %, focus latitude is impaired.

The component other than the copolymer which is contained in the resin (A) in an amount of less than about 10 mass % is preferably a polymer containing an acid-dissociable group-containing repeating unit in an amount of about 55 mol % or less, and preferably about 50 mol % or less.

Acid Generator (B)

The acid generator (B) is a component which generates an acid by exposure to radiation. The acid generator functions as a photoacid generator. The acid generator causes the acid-dissociable group in the resin (A) which is contained in the radiation-sensitive resin composition to dissociate (by causing a protective group to dissociate) by the action of an acid generated upon exposure and causes the resin (A) to become alkali soluble. As a result, the exposed area on the resist film is rendered soluble in an alkaline developer to form a positive-tone resist pattern.

The acid generator (B) contains the radiation-sensitive acid generator shown by the formula (6) or (7).

As examples of the alkyl group having 1 to 10 carbon atoms represented by $R^{14}$ in the formula (6), a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, an n-heptyl group, an n-octyl group, a 2-ethylhexyl group, an n-nonyl group, an n-decyl group, a cyclopropyl group, a cyclobutyl group, a cyclopentyl group, a cyclohexyl group, a cycloheptyl group, and the like can be given. Of these alkyl groups, a methyl group, an ethyl group, an n-butyl group, a t-butyl group, a cyclohexyl group, and the like are preferable.

As examples of the alkoxyl group having 1 to 10 carbon atoms represented by $R^{14}$ in the formula (6), a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like can be given. Of these, a methoxy group, an ethoxy group, an n-propoxy group, a n-butoxy group, and the like are preferable.

As examples of the alkoxycarbonyl group having 2 to 11 carbon atoms represented by $R^{14}$ in the formula (6), a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group, and the like can be given. Of these alkoxycarbonyl groups, a methoxycarbonyl group, an ethoxycarbonyl group, an n-butoxycarbonyl group, and the like are preferable.

As examples of the linear or branched alkyl group having 1 to 4 carbon atoms represented by $R^{15}$, $R^{16}$, and $R^{17}$ in the formula (7), a methyl group, an ethyl group, an n-propyl group, an i-propyl group, an n-butyl group, a 2-methylpropyl group, a 1-methylpropyl group, a t-butyl group, and the like can be given.

As the 3 to 6-membered ring structure formed by $R^{16}$ and $R^{17}$ together with the sulfur atom in the formula (7), a five-membered ring or a six-membered ring is preferable, with a five-member tetrahydrothiophene ring being more preferable.

$Y^-$ in the formulas (6) and (7) represents an anion shown by the formula $R^{18}C_nF_{2n}SO_3^-$ or $R^{18}SO_3^-$ (wherein $R^{18}$ is a hydrogen atom, a fluorine atom, or a substituted or unsubstituted hydrocarbon group having 1 to 12 carbon atoms, and n is an integer of 1 to 10), or an anion shown by the following formula (8-1) or (8-2).

(8-1)

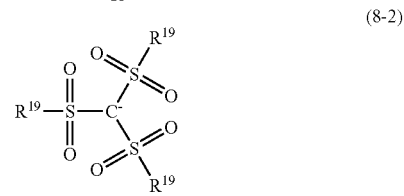

(8-2)

wherein $R^{19}$ individually represents a linear or branched fluoroalkayl group having 1 to 10 carbon atoms, or the two $R^{19}$s in combination represent a divalent fluorine-containing group having 2 to 10 carbon atoms. The divalent fluorine-containing group may have a substituent.

In the above formulas (6) and (7), the $C_nF_{2n}^-$ group in the anion shown by the formula $R^{18}C_nF_{2n}SO_3^-$ represented by $Y^-$ is a perfluoroalkylene group, with the alkylene group being either linear or branched, and n is preferably 1, 2, 4, or 8.

The hydrocarbon group having 1 to 12 carbon atoms which may have a substituent represented by $R^{18}$ in the anions shown by the formula $R^{18}C_nF_{2n}SO_3^-$ and $R^{18}SO_3^-$ is preferably an alkyl group having 1 to 12 carbon atoms, a cycloalkyl group, or a bridged alicyclic hydrocarbon group. As specific examples, a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like can be given.

As examples of the linear or branched fluoroalkyl group having 1 to 10 carbon atoms represented by $R^{19}$ in the formulas (8-1) and (8-2), a trifluoromethyl group, a pentafluoroethyl group, a heptafuluoropropyl group, a nonafluorobutyl group, a dodecafluoropentyl group, a perfluorooctyl group, and the like can be given.

As examples of the divalent fluoroalkyl group having 2 to 10 carbon atoms formed by combination of two $R^{19}$s in the formula (8-1) and (8-2), a tetrafluoroethylene group, a hexafluoropropylene group, an octafluorobutylene group, a decafluoropentylene group, an undecafluorohexylene group, and the like can be given.

As preferable anion moieties in the formulas (6) and (7), a trifluoromethanesulfonate anion, a perfluoro-n-butanesulfonate anion, a perfluoro-n-octanesulfonate anion, a 2-bicyclo[2.2.1]hept-2-yl-1,1,2,2-tetrafluoroethanesulfonate anion, a 2-bicyclo[2.2.1]hept-2-yl-1,1-difluoroethanesulfonate anion, a 1-adamantylsulfonate anion, the anions shown by the following formulas (9-1) to (9-7), and the like can be given.

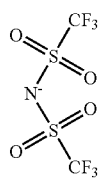
(9-1)

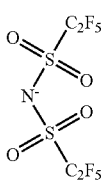
(9-2)

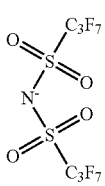
(9-3)

(9-4)

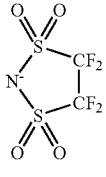
(9-5)

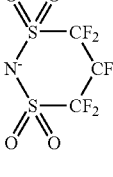
(9-6)

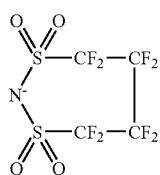
(9-7)

The acid generators shown by the formulas (6) and (7) are provided by the combination of the cations and anions mentioned above. The combination is appropriately selected without a particular limitation.

In addition to the compounds mentioned above, onium salt compounds, halogen-containing compounds, diazoketone compounds, sulfone compounds, sulfonate compounds, and the like can be used as the acid generator (B).

As examples of the onium salt compounds, an iodonium salt, a sulfonium salt, a phosphonium salt, a diazonium salt, and a pyridinium salt can be given. As specific examples of the onium salt compounds, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl 2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, and the like can be given.

As examples of the halogen-containing compound, haloalkyl group-containing hydrocarbon compounds and haloalkyl group-containing heterocyclic compounds can be given. As specific examples of the halogen-containing compound, (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, 1,1-bis(4-chlorophenyl)-2,2,2-trichloroethane, and the like can be given.

As examples of the diazoketone compound, 1,3-diketo-2-diazo compounds, diazobenzoquinone compounds, and diazonaphthoquinone compounds can be given. As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4-hydroxyphenyl)ethane, and the like can be given.

As examples of the sulfone compound, β-ketosulfone, β-sulfonylsulfone, and α-diazo compounds of these compounds can be given. As specific examples of the sulfone compound, 4-trisphenacylsulfone, mesitylphenacylsulfone, bis(phenylsulfonyl)methane, and the like can be given.

As examples of the sulfonic acid compound, alkyl sulfonate, alkylimide sulfonate, haloalkyl sulfonate, aryl sulfonate, and imino sulfonate can be given. As specific examples of the sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like can be given.

The acid generator (B) used in the embodiment of the present invention is preferably an acid generator containing a compound shown by the above formula (6) or (7). The acid generators shown by the formula (6) or (7) may be used either individually or in combination with other acid generators. It is preferable to use three or more acid generators in combination, that is, a combination of the acid generators shown by the formula (6) or (7) or a combination of the acid generators shown by the formula (6) or (7) and the other acid generators. Such a combination produces an excellent pattern shape.

The amount of the acid generator (B) is preferably 0.1 to 20 parts by mass, and more preferably 0.5 to 15 parts by mass for 100 parts by mass of the resin (A) from the viewpoint of ensuring sensitivity and developability as a resist. If this amount is less than 0.1 part by mass, the sensitivity and developability may be impaired. On the other hand, if the amount is more than 20 parts by mass, the radiation transmittance of the composition may decrease so that a rectangular resist pattern may not be obtained.

Solvent (C)

The radiation-sensitive resin composition according to the embodiment of the present invention is usually used in the form of a composition solution prepared by dissolving the composition in a solvent so that the total solid content is usually 1 to 50 mass %, and preferably 1 to 25 mass %, and filtering the solution using a filter with a pore diameter of about 0.2 µm, for example.

Examples of the solvent (C) include, in addition to linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; and alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Among these, linear or branched ketones, cyclic ketones, propylene glycol monoalkyl ether acetates, alkyl 2-hydroxypropionates, alkyl 3-alkoxypropionates, γ-butyrolactone, and the like are preferable.

These solvents (C) may be used either individually or in combination of two or more.

Additives

To the extent not impairing the effect of the present invention, the radiation-sensitive resin composition according to the embodiment of the present invention may optionally contain various kinds of additives such as a acid diffusion controller, an alicyclic additive, a surfactant, a photosensitizer, and the like.

<Acid Diffusion Controller>

The acid diffusion controllers control diffusion of an acid generated from the acid generator upon exposure in the resist film to suppress undesirable chemical reactions in the unexposed area.

The storage stability of the radiation-sensitive resin composition can be improved by adding the acid diffusion controller. Moreover, the addition of the acid diffusion controller further improves the resolution of the resist, and suppresses a change in line width of the resist pattern due to a variation in post-exposure delay (PED) from exposure to post-exposure heat treatment so that a composition that exhibits excellent process stability can be obtained.

As examples of the acid diffusion controller, nitrogen-containing organic compounds such as tertiary amine compounds, amide group-containing compounds, quaternary ammonium hydroxide compounds, and nitrogen-containing heterocyclic compounds can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline; alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, bis(2-dimethylaminoethyl) ether, bis(2-diethylaminoethyl)ether, and the like.

As examples of the amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole; and the like can be given.

As examples of the quaternary ammonium hydroxide compound, tetra-n-propylammonium hydroxide, tetra-n-butylammonium hydroxide, and the like can be given.

Examples of the nitrogen-containing heterocyclic compound include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, 2-phenylbenzimidazole, N-t-butoxycarbonylbenzimidazole, N-t-butoxycarbonyl-2-methylbenzimidazole, N-t-butoxycarbonyl-2-phenylbenzimidazole, and the like.

These nitrogen-containing compounds may be used either individually or in combination of two or more.

The amount of the acid diffusion controller used in the embodiment of the present invention is usually not more than 10 parts by mass, preferably not more than 5 parts by mass for 100 parts by mass of the resin (A) from the viewpoint of ensuring high sensitivity as a resist. If this amount is more than 10 parts by mass, the sensitivity of the resist may be unduly impaired. If the amount is less than 0.001 part by mass, the pattern configuration or dimensional accuracy as a resist may decrease depending on the processing conditions.

<Alicyclic Additives>

The alicyclic additives improve dry etching resistance, pattern shape, and adhesion to the substrate.

As examples of the alicyclic additives, adamantane derivatives such as 1-adamantane carboxylate, 2-adamantanon, t-butyl-1-adamantane carboxylate, t-butoxycarbonylmethyl-1-adamantane carboxylate, α-butyrolactone-1-adamantane carboxylate, di-t-butyl-1,3-adamantanedicarboxylate, t-butyl-1-adamantane acetate, t-butoxycarbonylmethyl-1-adamantane acetate, di-t-butyl-1,3-adamantane diacetate, and 2,5-dimethyl-2,5-di(adamantylcarbonyloxy)hexane; 5-[2-hydroxy-2,2-bis(trifluoromethyl)ethyl]tetracyclo[6.2.1.1$^{3,6}$.0$^{2,7}$]dodecane can be given.

These alicyclic additives may be used either individually or in combination of two or more.

<Surfactants>

The surfactant improves applicability, striation, developability, and the like of the radiation-sensitive resin composition.

As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given.

These surfactants may be used either individually or in combination of two or more.

<Sensitizer>

The sensitizers absorb radiation energy and transmit the energy to the acid generator (B), thereby increasing the amount of acid generated upon exposure. The sensitizers improve apparent sensitivity of the radiation-sensitive resin composition.

As examples of the sensitizer, carbazoles, acetophenones, benzophenones, naphthalenes, phenols, biacetyl, Eosine, Rose Bengal, pyrenes, anthracenes, phenothiazines, and the like can be given.

These sensitizers may be used either individually or in combination of two or more.

In addition to the above additives, an alkali-soluble polymer, a low molecular weight alkali solubility controller containing an acid dissociable protecting group, a halation inhibitor, a preservation stabilizer, an antifoaming agent, and the like may be added to the radiation-sensitive resin composition according to the embodiment of the present invention. Addition of a dye or a pigment visualizes a latent image in the exposed area, thereby decreasing the effects of halation during exposure. Use of an adhesion improver improves adhesion to the substrate.

Formation of Resist Pattern

The radiation-sensitive resin composition according to the embodiment of the present invention is particularly useful as a chemically-amplified resist. In the chemically-amplified resist, an acid-dissociable group in the resin components, mainly the copolymer containing more than about 55 mol % of acid-dissociable group-containing repeating units shown by the formula (1) or (2), dissociate by the action of an acid generated from the acid generator upon exposure, thereby producing a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition according to the embodiment of the present invention by applying the resin composition solution to, for example, substrates such as a silicon wafer or a wafer coated with aluminum using an appropriate application method such as rotational coating, cast coating, and roll coating to form a resist film. The resist film is then optionally pre-baked (hereinafter called "PB") and exposed to radiation to form a prescribed resist pattern. As radiation used for exposure, visible rays, ultraviolet rays, deep ultraviolet rays, X-rays, charged particle beams, or the like are appropriately selected depending on types of the acid generator. It is preferable to use an ArF excimer laser (wavelength: 193 nm) or KrF excimer laser (wavelength: 248 nm). An ArF excimer laser (wavelength: 193 nm) is particularly preferable.

The exposure conditions such as the light exposure are appropriately determined depending on the composition of the radiation-sensitive resin composition, types of additives, and the like. When using the radiation-sensitive resin composition according to the embodiment of the present invention, it is preferable to perform post-exposure bake (PEB) after exposure. The PEB ensures a smooth dissociation reaction of the acid-dissociable group contained in the polymer components. The heating temperature for the PEB is usually 30 to 200° C., and preferably 50 to 170° C., although the heating conditions are changed according to the component composition of the radiation-sensitive resin composition.

In order to bring out the potential of the radiation-sensitive resin composition to the maximum extent when forming a resist pattern, an organic or inorganic antireflection film may be formed on the substrate as disclosed in JP-B-6-12452 (JP-A-59-93448), for example. In addition, a protective film may be provided on the resist film in order to prevent an adverse effect of basic impurities and the like that are present in the environmental atmosphere using a method described in, for example, JP-A-5-188598. Moreover, in order to prevent the acid generator and the like from flowing out of the resist film during liquid immersion lithography, a protective film for liquid immersion lithography may be provided on the resist film as disclosed in, for example, JP-A-2005-352384. These techniques may be used in combination.

The exposed resist film is then developed to form a prescribed resist pattern. As examples of the developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 mass % or less. If the concentration of the alkaline aqueous solution exceeds 10 mass %, an unexposed part may be dissolved in the developer.

Organic solvents may be added to the developer containing an alkaline aqueous solution.

As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol; acetonylacetone; and dimethylformamide can be given.

These organic solvents may be used either individually or in combination of two or more.

The amount of the organic solvent to be used is preferably 100 vol % or less of the alkaline aqueous solution. If the amount of the organic solvent is more than 100 vol %, the developability may decrease so that the exposed area may remain undeveloped.

In addition, surfactants or the like may be added to the developer containing the alkaline aqueous solution in an appropriate amount.

After development using the alkaline aqueous solution developer, the resist film is generally washed with water and dried.

EXAMPLES

The embodiments of the present invention are further described below by way of examples. However, these examples should not be construed as limiting the present invention. In the Examples, "part" and "%" respectively refer to "part by mass" and "mass %", unless otherwise indicated.

[1] Synthesis of Copolymer Used for Acid-Dissociable Group-Containing Resin (A)

Copolymers (A-1) to (A-7) were synthesized as described in the following synthesis examples. Compounds (M-1) to (M-7) used as monomers in the synthesis examples are as follows.

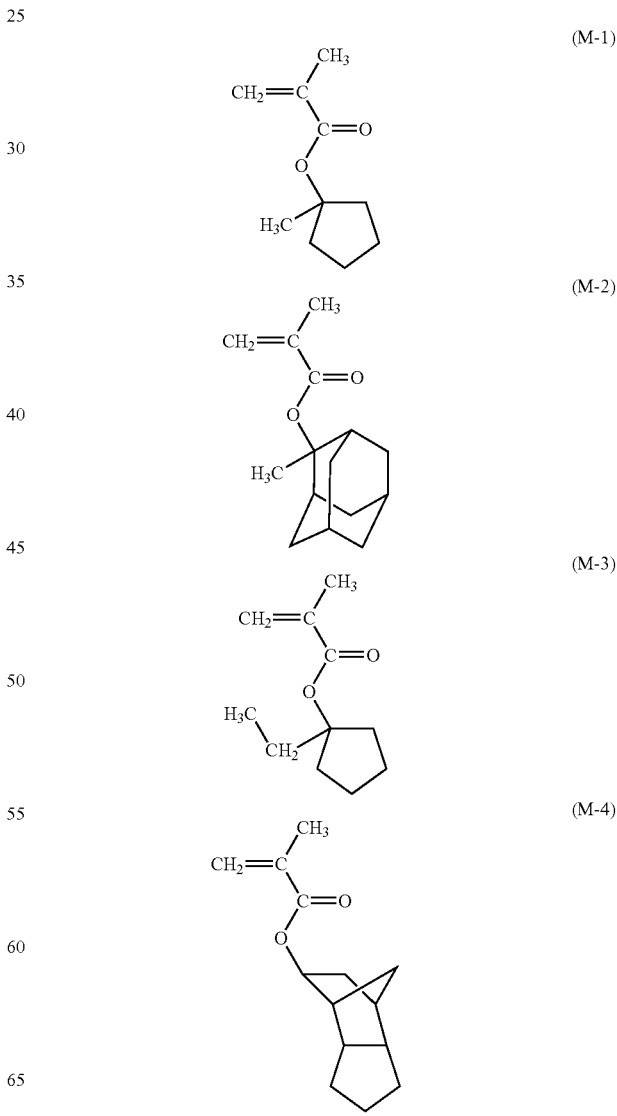

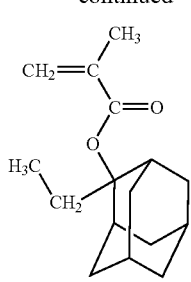

(M-5)

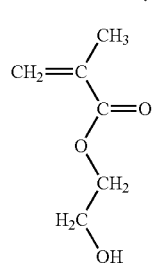

(M-6)

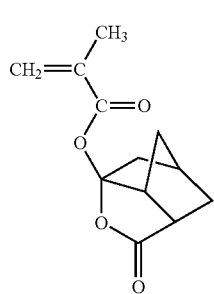

(M-7)

Synthesis Example 1

A monomer solution was prepared by dissolving 26.59 g (60 mol %) of the compound (M-1) and 23.41 g (40 mol %) of the compound (M-7) in 100 g of 2-butanone, and further adding 2.16 g (5 mol %) of azobis(isobutylonitrile). A 500 ml three-necked flask charged with 50 g of 2-butanone was purged with nitrogen for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried at 50° C. for 17 hours to obtain a copolymer in the form of a white powder (43 g, yield 86%).

The copolymer had a weight average molecular weight (Mw) of 5213, Mw/Mn of 1.453, and the ratio of the repeating units derived from the compound (M-1) and the compound (M-7) determined by $^{13}$C-NMR and $^1$H-NMR analysis was 58.6:41.4 (mol %). The content of the acid-dissociable group-containing repeating units in the copolymer was 58.6 mol %. This copolymer is referred to as a "copolymer (A-1)".

Synthesis Example 2

A monomer solution was prepared by dissolving 30.63 g (60 mol %) of the compound (M-2) and 19.37 g (40 mol %) of the compound (M-7) in 100 g of 2-butanone, and further adding 1.79 g (5 mol %) of azobis(isobutylonitrile). A 500 ml three-necked flask charged with 50 g of 2-butanone was purged with nitrogen for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried for 17 hours at 50° C. to obtain a copolymer in the form of a white powder (40 g, yield 80%).

The copolymer had an Mw of 4632, Mw/Mn of 1.660, and the ratio of the repeating units derived from the compound (M-2) and the compound (M-7) determined by $^{13}$C-NMR and $^1$H-NMR analysis was 60.5:39.5 (mol %). The content of the acid-dissociable group-containing repeating units in the copolymer was 60.5 mol %. This copolymer is referred to as a "copolymer (A-2)".

Synthesis Example 3

A monomer solution was prepared by dissolving 21.54 g (50 mol %) of the compound (M-1) and 28.46 g (50 mol %) of the compound (M-7) in 100 g of 2-butanone, and further adding 2.16 g (5 mol %) of azobis(isobutylonitrile). A 500 ml three-necked flask charged with 50 g of 2-butanone was purged with nitrogen for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried for 17 hours at 50° C. to obtain a copolymer in the form of a white powder (42 g, yield 84%).

The copolymer had a weight average molecular weight (Mw) of 5520, Mw/Mn of 1.482, and the ratio of the repeating units derived from the compound (M-1) and the compound (M-7) determined by $^{13}$C-NMR and $^1$H-NMR analysis was 49.2:50.8 (mol %). The content of the acid-dissociable group-containing repeating units in the copolymer was 49.2 mol %. This copolymer is referred to as a "copolymer (A-3)".

Synthesis Example 4

A monomer solution was prepared by dissolving 35.38 g (40 mol %) of the compound (M-3), 10.69 g (10 mol %) of the compound (M-4), and 53.93 g (50 mol %) of the compound (M-7) in 200 g of 2-butanone, and further adding 5.58 g of dimethyl 2,2'-azobis(2-methylpropionate). A 1000 ml three-necked flask was charged with 100 g of 2-butanone and purged with nitrogen gas for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or lower and poured into 2000 g of methanol. A white precipitate produced was collected by filtration. The filtered white powder was washed twice with 400 g of methanol in the form of slurry, filtered, and dried at 50° C. for 17 hours to obtain a copolymer in the form of a white powder (72 g, yield of 72%). The copolymer had an Mw of 7400, Mw/Mn of 1.660, and the ratio of the repeating units derived from the compound (M-3), the compound (M-4), and the compound (M-7) determined by $^{13}$C-NMR and $^1$H-NMR analysis was 39.2:8.6:52.2 (mol %). The content of the acid-dissociable group-containing repeating units in the copolymer was 39.2 mol %. This copolymer is referred to as a "copolymer (A-4)".

Synthesis Example 5

12.65 g (30 mol %) of the compound (M-1), 3.26 g (10 mol %) of the compound (M-6), and 27.86 g (50 mol %) of the compound (M-7) were dissolved in 100 g of 2-butanone, and 2.06 g of azobis(isobutyronitrile) was further added to prepare a monomer solution. A 1000 ml three-necked flask charged with 6.23 g (10 mol %) of the compound (M-5) and 50 g of 2-butanone was purged with nitrogen gas for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried at 50° C. for 17 hours to obtain a polymer in the form of a white powder (38 g, yield 76%).

The copolymer had an Mw of 6249, Mw/Mn of 1.542, and the ratio of the repeating units derived from the compound (M-1), the compound (M-5), the compound (M-6), and the compound (M-7) determined by $^{13}$C-NMR and $^1$H-NMR analysis was 30.2:9.6:9.8:50.4 (mol %). The content of the acid-dissociable group-containing repeating units in the copolymer was 39.8 mol %. This copolymer is referred to as a "copolymer (A-5)".

Synthesis Example 6

A monomer solution was prepared by dissolving 25.66 g (50 mol %) of the compound (M-2) and 24.34 g (50 mol %) of the compound (M-7) in 100 g of 2-butanone, and further adding 1.80 g (5 mol %) of azobis(isobutyronitrile). A 500 ml three-necked flask charged with 50 g of 2-butanone was purged with nitrogen for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried for 17 hours at 50° C. to obtain a copolymer in the form of a white powder (41 g, yield 82%).

The copolymer had an Mw of 5235, Mw/Mn of 1.623, and the ratio of the repeating units derived from the compound (M-2) and the compound (M-7) determined by $^{13}$C-NMR and $^1$H-NMR analysis was 50.5:49.5 (mol %). The content of the acid-dissociable group-containing repeating units in the copolymer was 50.5 mol %. This copolymer is referred to as a "copolymer (A-6)".

Synthesis Example 7

A monomer solution was prepared by dissolving 18.60 g (35 mol %) of the compound (M-2), 6.20 g (15 mol %) of the compound (M-3), and 25.20 g (50 mol %) of the compound (M-7) in 100 g of 2-butanone, and further adding 0.73 g (2 mol %) of azobis(isobutylonitrile). A 500 ml three-necked flask charged with 50 g of 2-butanone was purged with nitrogen for 30 minutes. The flask was then heated to 80° C. with stirring, and the monomer solution was added dropwise to the flask using a dropping funnel over three hours. The polymerization reaction was carried out for six hours after initiation of the addition of the monomer solution. After completion of polymerization, the polymer solution was cooled with water to 30° C. or less and added to 1000 g of methanol, and the precipitated white powder was collected by filtration. The white powder collected by filtration was washed twice with 200 g of methanol in a slurry state, filtered again, and dried at 50° C. for 17 hours to obtain a polymer in the form of a white powder (44 g, yield 88%).

The copolymer had an Mw of 5437, Mw/Mn of 1.452, and the ratio of the repeating units derived from the compound (M-2), the compound (M-3), and the compound (M-7) determined by $^{13}$C-NMR and $^1$H-NMR analysis was 36.2:15.0:48.8 (mol %). The content of the acid-dissociable group-containing repeating units in the copolymer was 51.2 mol %. This copolymer is referred to as a "copolymer (A-7)".

The measurement and evaluation in the synthesis examples were carried out according to the following procedures.

<Mw and Mn>

The Mw and Mn of the copolymer were measured by gel permeation chromatography (GPC) with monodispersed polystyrene as a standard reference material using a GPC column (manufactured by Tosoh Corp., G2000HXL×2, G3000HXL×1, G4000HXL×1) at a flow rate of 1.0 ml/minute and a column temperature of 40° C. using tetrahydrofuran as an eluate. The dispersibility (Mw/Mn) was calculated from the measurement results.

<$^{13}$C-NMR Analysis>

$^{13}$C-NMR analysis of each polymer was carried out using "JNM-EX270" (manufactured by JEOL Ltd.).

<$^1$H-NMR Analysis>

$^1$H-NMR analysis of each polymer was carried out using "JNM-EX270" (manufactured by JEOL Ltd.).

Examples 1 to 7 and Comparative Examples 1 to 9

The copolymer (A), the acid generator (B), and the acid diffusion controller (D) shown in Table 1 were dissolved in the solvent (C) in proportions shown in Table 1. The mixed solutions were filtered through a membrane filter with a pore diameter of 0.2 μm to prepare radiation-sensitive resin composition solutions of Examples 1 to 7 and Comparative Examples 1 to 9.

TABLE 1

| | Resin (A) | | Acid generator (B) (type/part) | Acid diffusion controller (D) (type/part) | Solvent (C) (type/part) |
|---|---|---|---|---|---|
| | (type/part) | Content of acid-dissociable group (%) | | | |
| Example 1 | A-1/100 | 58.6 | B-1/4; B-2/5; B-3/2 | D-1/1.08 | C-1/1300; C-2/557; C-3/30 |
| Example 2 | A-1/100 | 58.6 | B-1/4; B-2/5 | D-1/1.08 | C-1/1300; C-2/557; C-3/30 |
| Example 3 | A-1/100 | 58.6 | B-3/11 | D-1/1.08 | C-1/1300; C-2/557; C-3/30 |
| Example 4 | A-2/100 | 60.5 | B-4/2; B-2/2; B-3/4 | D-1/0.43 | C-1/1300; C-2/557; C-3/30 |
| Example 5 | A-2/100 | 60.5 | B-4/2; B-2/6 | D-1/0.43 | C-1/1300; C-2/557; C-3/30 |
| Example 6 | A-2/100 | 60.5 | B-3/10 | D-1/0.43 | C-1/1300; C-2/557; C-3/30 |
| Example 7 | A-1/95; A-4/5 | 57.6 | B-1/4; B-2/5; B-3/2 | D-1/1.08 | C-1/1300; C-2/557; C-3/30 |
| Comparative Example 1 | A-3/100 | 49.2 | B-1/4; B-2/5; B-3/2 | D-1/1.08 | C-1/1300; C-2/557; C-3/30 |
| Comparative Example 2 | A-4/100 | 39.2 | B-1/4; B-2/5; B-3/2 | D-1/1.08 | C-1/1300; C-2/557; C-3/30 |
| Comparative Example 3 | A-3/100 | 49.2 | B-1/4; B-2/5 | D-1/1.08 | C-1/1300; C-2/557; C-3/30 |
| Comparative Example 4 | A-5/100 | 39.8 | B-1/4; B-2/5 | D-1/1.08 | C-1/1300; C-2/557; C-3/30 |
| Comparative Example 5 | A-6/100 | 50.5 | B-4/2; B-2/2; B-3/4 | D-1/0.43 | C-1/1300; C-2/557; C-3/30 |
| Comparative Example 6 | A-6/100 | 50.5 | B-4/2; B-3/6 | D-1/0.43 | C-1/1300; C-2/557; C-3/30 |
| Comparative Example 7 | A-7/100 | 51.2 | B-4/2; B-3/6 | D-1/0.43 | C-1/1300; C-2/557; C-3/30 |
| Comparative Example 8 | A-1/70; A-4/30 | 52.8 | B-1/4; B-2/5; B-3/2 | D-1/1.08 | C-1/1300; C-2/557; C-3/30 |
| Comparative Example 9 | A-2/70; A-4/30 | 54.1 | B-4/2.4; B-2/7.2 | D-1/1.08 | C-1/1300; C-2/557; C-3/30 |

The acid generators (B), the solvents (C), and the acid diffusion controllers (C) in Table 1 are as follows.

<Acid Generator (B)>

B-1: 4-cyclohexylphenyldiphenylsulfonium nonafluoro-n-butanesulfonate

B-2: 1-(4-n-butoxynaphthalen-1-yl)tetrahydrothiophenium 2-bicyclo[2.2.1]hept-2-yl-1,1,2,2-tetrafluoroethanesulfonate B-3: 1-(4-n-butoxynaphthalen-1-yl)tetrahydrothiophenium nonafluoro-n-butanesulfonate B-4: triphenylsulfonium 2-(3-tetracyclo[4.4.0.1$^{2,5}$.1$^{7,10}$]dodecanyl)-1,1-difluoroethanesulfonate <Solvent (C)>

C-1: propylene glycol monomethyl ether acetate

C-2: cyclohexanone

C-3: γ-butyrolactone

<Acid Diffusion Controller (D)>

D-1: N-t-butoxycarbonyl-4-hydroxypiperidine

The following evaluations were carried out using the radiation-sensitive resin compositions obtained in the examples and comparative examples. The results are shown in Table 2.

<Sensitivity>

When irradiating with light from an ArF light source, the composition solution was applied by spin coating to a silicon wafer on which an AR46 (manufactured by Rohm & Haas) film with a thickness of 29 nm was formed using Clean Track ACT08 (manufactured by Tokyo Electron, Ltd.), and baked (PB) on a hot plate at 110° C. for 60 seconds to obtain a resist film with a thickness of 0.14 μm. The film was exposed to light from an ArF excimer laser through a mask pattern (6% half-tone mask) using an ArF excimer laser exposure apparatus (manufactured by Nikon Corp., numerical aperture: 0.78). After performing PEB at 110° C. for 60 seconds using Clean Track ACTS (manufactured by Tokyo Electron, Ltd.), the resist film was developed at 25° C. for 60 seconds in a 2.38% tetramethylammonium hydroxide aqueous solution, washed with water, and dried to form a positive-tone resist pattern. In this instance, an exposure dose to make a contact hole pattern with a diameter of 0.08 μm from a contact hole pattern (1H1S) of 0.08 μm on the mask was regarded as the optimum dose, and an exposure dose to make a line-and-space pattern with a diameter of 0.075 μm from a line-and-space pattern (1L1S) with a diameter of 0.075 μm on the mask was regarded as the optimum dose (mJ/cm$^2$).

<Resolution>

The minimum dimension (diameter) of the resist pattern resolved at the optimum dose was taken as the resolution.

<Focus Latitude>

The resist was exposed at the optimum dose determined in the evaluation of sensitivity under the conditions in which the depth of focus was offset at an interval of 0.05 μm in the range from −1.0 μm to +1.0 μm. The range (μm) in which the line width was −10% to +10% with respect to the value at the optimum dose was taken as focus latitude (DOF). A larger DOF indicates better focus latitude. A resist with a DOF value of 0.3 μm or more was evaluated as "Good, and a resist with a DOF value of less than 0.3 μm was evaluated as "Bad".

<Roundness>

The composition solution was applied by spin coating to a silicon wafer on which an ARC95 (manufactured by Nissan Chemical Co., Ltd.) film with a thickness of 85 nm was formed using Clean Track ACT8 (manufactured by Tokyo Electron), and baked (PB) on a hot plate under the conditions shown in Table 2 to obtain a resist film with a thickness of 0.14 μm. The film was exposed at the optimum dose through a mask pattern (6% half-tone mask) using an ArF excimer laser exposure apparatus (S306C manufactured by Nikon Corp., lens numerical aperture: 0.78). After performing PEB under the conditions shown in Table 2 using Clean Track ACT8 (manufactured by Tokyo Electron, Ltd.), the resist film was developed at 25° C. for 60 seconds in a 2.38 mass % tetramethylammonium hydroxide aqueous solution, washed with water, and dried to form a positive-tone resist pattern (contact hole pattern (1H1S, diameter: 0.09 μm)).

The diameters of 16 holes of the contact hole pattern was measured using "SEM S-9380" (manufactured by Hitachi, Ltd.) and Offline CD Measurement Software (Version 5.03). The same measurement was carried out on 20 contact holes, and the three sigma (3σ) of the resulting average standard deviation (σ) was calculated to evaluate the roundness according to the following standard.

Good: 3σ was 4.0 or less.

Bad: 3σ was more than 4.0.

<Line Width Roughness (LWR)>

A 75 nm (1L1S) pattern formed on the resist film on the substrate at the optimum dose was observed from above the pattern using "SEM S9380" (manufactured by Hitachi, Ltd.) to measure the diameter at arbitrary points. The fluctuation was indicated by 3σ.

The smaller the value, the better the LWR. LWR was evaluated as "Good" when the value was 9.0 nm or less.

TABLE 2

| | Sensitivity (mJ/cm$^2$) | Resolution (μm) | Focus latitude (μm/mJ) | Roundness (nm) | LWR (nm) |
|---|---|---|---|---|---|
| Example 1 | 43.0 | 0.80 (Good) | 0.30 (Good) | 3.0 (Good) | — |
| Example 2 | 44.0 | 0.80 (Good) | 0.30 (Good) | 3.6 (Good) | — |
| Example 3 | 44.0 | 0.80 (Good) | 0.30 (Good) | 3.9 (Good) | — |
| Example 4 | 31.0 | 0.75 (Good) | 0.30 (Good) | — | 7.2 (Good) |
| Example 5 | 32.0 | 0.75 (Good) | 0.30 (Good) | — | 8.4 (Good) |
| Example 6 | 32.0 | 0.75 (Good) | 0.30 (Good) | — | 8.8 (Good) |
| Example 7 | 43.0 | 0.75 (Good) | 0.30 (Good) | 3.5 (Good) | — |
| Comparative Example 1 | 45.0 | 0.80 (Good) | 0.25 (Bad) | 3.8 (Good) | — |
| Comparative Example 2 | 43.0 | 0.80 (Good) | 0.20 (Bad) | 3.6 (Good) | — |
| Comparative Example 3 | 45.0 | 0.80 (Good) | 0.25 (Bad) | 4.3 (Bad) | — |
| Comparative Example 4 | 42.0 | 0.80 (Good) | 0.25 (Bad) | 4.1 (Bad) | — |
| Comparative Example 5 | 33.0 | 0.75 (Good) | 0.25 (Bad) | — | 8.2 (Good) |
| Comparative Example 6 | 33.0 | 0.75 (Good) | 0.25 (Bad) | — | 9.3 (Bad) |
| Comparative Example 7 | 33.0 | 0.75 (Good) | 0.25 (Bad) | — | 8.1 (Good) |
| Comparative Example 8 | 43.0 | 0.80 (Good) | 0.25 (Bad) | 3.7 (Good) | — |
| Comparative Example 9 | 32.0 | 0.75 (Good) | 0.25 (Bad) | — | 8.5 (Good) |

The radiation-sensitive resin composition according to the embodiment of the present invention exhibits high radiation transparency, has excellent basic resist properties such as excellent sensitivity and dry etching resistance, and exhibits excellent resolution, focus latitude, and pattern shape. Therefore, the resin composition is extremely useful for manufacturing integrated circuit devices which are anticipated to become more and more scaled down in the future.

What is claimed as new and desired to be secured by Letters Patent of the United States is:

1. A radiation-sensitive resin composition comprising:

an acid-dissociable group-containing resin comprising a copolymer containing a repeating unit;

a radiation-sensitive acid generator; and a solvent, wherein the repeating unit comprises an acid-dissociable group-containing repeating unit in an amount of more than about 55 mol % with respect to a total amount of the repeating unit in the copolymer, and a content of the copolymer in the acid-dissociable group-containing resin is about 90 mass % or more with respect to a total amount of the acid-dissociable group-containing resin.

2. The composition according to claim 1, wherein the acid-dissociable group-containing repeating unit is shown by the following formula (1) or (2), (1)

(2)

wherein $R^1$ and $R^3$ individually represent a hydrogen atom, a methyl group, or a trifluoromethyl group, and $R^2$ and $R^4$ individually represent a hydrogen atom or a substituted or unsubstituted alkyl group having 1 to 4 carbon atoms.

3. The composition according to claim 1, wherein the radiation-sensitive acid generator comprises a radiation-sensitive acid generator shown by the following formula (6) or (7), (6)

(7)

wherein $R^{14}$ individually represents a hydrogen atom, a fluorine atom, a hydroxyl group, an alkyl group having 1 to 10 carbon atoms, an alkoxyl group, or an alkoxycarbonyl group having 2 to 11 carbon atoms, $R^{15}$ individually represents a hydrogen atom or a linear or branched alkyl group having 1 to 4 carbon atoms, n represents 0 or 1, $R^{16}$ and $R^{17}$ individually represent a hydrogen atom or a linear or branched alkyl group having 1 to 4 carbon atoms, or in combination form a 3 to 6-membered ring structure together with the sulfur atom, and $Y^-$ represents a sulfur atom-containing anion.

4. The composition according to claim 3, wherein the radiation-sensitive acid generator comprises at least three different types of radiation-sensitive acid generators.

5. The composition according to claim 1, wherein the acid-dissociable group-containing resin further comprises a repeating unit having a lactone skeleton.

6. The composition according to claim 2, wherein the acid-dissociable group-containing resin comprises a copolymer (CP-1) or (CP-2) respectively comprising the following repeating units,

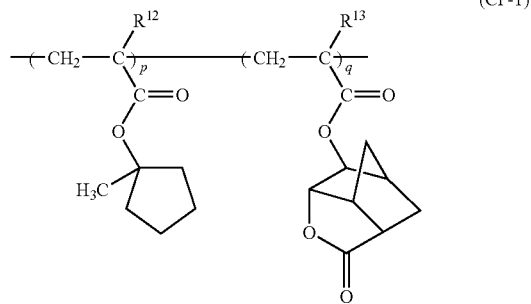

(CP-1)

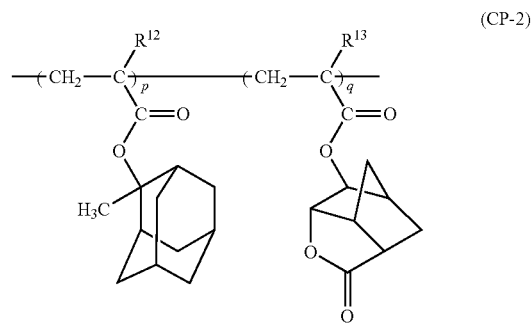

(CP-2)

wherein $R^{12}$ and $R^{13}$ individually represent a hydrogen atom or a methyl group.

7. The composition according to claim 1, further comprising an acid diffusion controller.

8. The composition according to claim 7, wherein the acid diffusion controller comprises a nitrogen-containing compound.

* * * * *